(12) United States Patent
Parekh et al.

(10) Patent No.: US 9,229,567 B2
(45) Date of Patent: Jan. 5, 2016

(54) ELECTRONIC DEVICE INCLUDING TOUCH-SENSITIVE DISPLAY

(75) Inventors: Premal Parekh, Waterloo (CA); Amit Pal Singh, Waterloo (CA)

(73) Assignee: BlackBerry Limited, Waterloo (CA)

( * ) Notice: Subject to any disclaimer, the term of this patent is extended or adjusted under 35 U.S.C. 154(b) by 438 days.

(21) Appl. No.: 13/360,218

(22) Filed: Jan. 27, 2012

(65) Prior Publication Data

US 2013/0194195 A1    Aug. 1, 2013

(51) Int. Cl.
| G06F 3/041 | (2006.01) |
| G09G 3/00 | (2006.01) |
| G06F 3/0488 | (2013.01) |
| G06F 3/044 | (2006.01) |
| G06F 3/0354 | (2013.01) |
| H05K 1/02 | (2006.01) |

(52) U.S. Cl.
CPC .............. *G06F 3/0416* (2013.01); *G06F 3/041* (2013.01); *G09G 3/00* (2013.01); *G06F 3/03547* (2013.01); *G06F 3/044* (2013.01); *G06F 3/0412* (2013.01); *G06F 3/0488* (2013.01); *G06F 3/04883* (2013.01); *H05K 1/0287* (2013.01); *H05K 1/0289* (2013.01)

(58) Field of Classification Search
CPC ..... G06F 3/0416; G06F 3/041; G06F 3/0412; G09G 3/00; H05K 1/0287; H05K 1/0289
USPC ................... 345/173–183; 178/18.01–20.04
See application file for complete search history.

(56) References Cited

U.S. PATENT DOCUMENTS

| 2007/0229468 | A1* | 10/2007 | Peng et al. | 345/173 |
| 2008/0062139 | A1* | 3/2008 | Hotelling et al. | 345/173 |
| 2008/0309627 | A1* | 12/2008 | Hotelling et al. | 345/173 |
| 2008/0309633 | A1 | 12/2008 | Hotelling et al. | |
| 2009/0174677 | A1* | 7/2009 | Gehani et al. | 345/173 |
| 2009/0189867 | A1* | 7/2009 | Krah et al. | 345/173 |
| 2011/0122073 | A1 | 5/2011 | Chen et al. | |
| 2011/0122091 | A1 | 5/2011 | King et al. | |
| 2011/0157070 | A1 | 6/2011 | Martin et al. | |
| 2011/0163992 | A1* | 7/2011 | Cordeiro et al. | 345/174 |
| 2011/0210940 | A1* | 9/2011 | Reynolds | 345/174 |

(Continued)

FOREIGN PATENT DOCUMENTS

| EP | 1455264 B1 | 5/2011 |
| EP | 2343631 A1 | 7/2011 |

(Continued)

OTHER PUBLICATIONS

International Search Report and Written Opinion of the International Searching Authority dated Apr. 23, 2013, issued in respect of International Patent Application No. PCT/CA2013/050048.
Extended European Search Report dated Jun. 11, 2012, issued from the corresponding European patent application No. 12152960.6.
Examiner's Report dated Apr. 7, 2014, issued in respect of corresponding Canadian Patent Application No. 2,838,769.

(Continued)

*Primary Examiner* — Jason Olson
*Assistant Examiner* — Sosina Abebe
(74) *Attorney, Agent, or Firm* — Geoffrey deKleine; Borden Ladner Gervais LLP

(57) ABSTRACT

A method includes detecting a touch on a touch-sensitive display, determining a time of a display update of the touch-sensitive display, and adjusting a scanning rate of scanning electrodes of the touch-sensitive display based on the time of the display update.

13 Claims, 3 Drawing Sheets

(56) References Cited

U.S. PATENT DOCUMENTS

2011/0210941 A1\* 9/2011 Reynolds et al. ............. 345/174
2012/0194466 A1\* 8/2012 Posamentier ................. 345/174

FOREIGN PATENT DOCUMENTS

| EP | 1234225 | B1 | 11/2011 |
| EP | 2027524 | B1 | 11/2011 |

OTHER PUBLICATIONS

Examiner's Report dated Dec. 10, 2014, issued in respect of corresponding Canadian Patent Application No. 2,838,769.
Examiner's Report dated Aug. 14, 2015, issued in respect of corresponding Canadian Patent Application No. 2,838,769.
Communication pursuant to Article 94(3) EPC dated Jul. 22, 2015, issued in respect of corresponding European Patent Application No. 12152960.6.

\* cited by examiner

ELECTRONIC DEVICE INCLUDING TOUCH-SENSITIVE DISPLAY

FIELD OF TECHNOLOGY

The present disclosure relates to electronic devices including, but not limited to, portable electronic devices having touch-sensitive displays and their control.

BACKGROUND

Electronic devices, including portable electronic devices, have gained widespread use and may provide a variety of functions including, for example, telephonic, electronic messaging and other personal information manager (PIM) application functions. Portable electronic devices include several types of devices including mobile stations such as simple cellular telephones, smart telephones (smart phones), Personal Digital Assistants (PDAs), tablet computers, and laptop computers, with wireless network communications or near-field communications connectivity such as Bluetooth® capabilities.

Portable electronic devices such as PDAs, or tablet computers are generally intended for handheld use and ease of portability. Smaller devices are generally desirable for portability. A touch-sensitive display, also known as a touchscreen display, is particularly useful on handheld devices, which are small and may have limited space for user input and output. The information displayed on the display may be modified depending on the functions and operations being performed.

Improvements in electronic devices with touch-sensitive displays are desirable.

DETAILED DESCRIPTION

Figure 1:
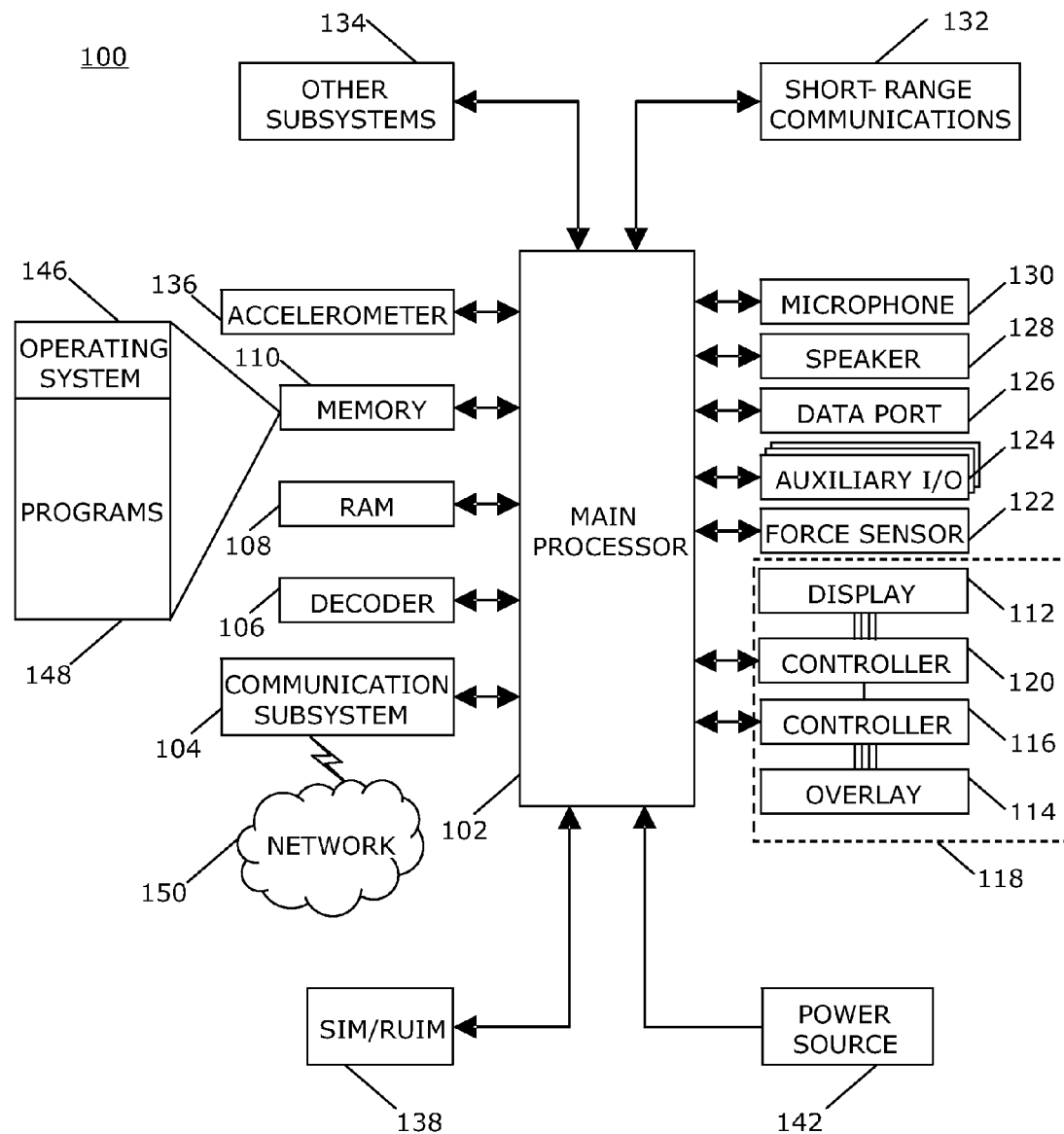
FIG. 1 is a block diagram of a portable electronic device in accordance with the disclosure.

The following describes an electronic device and a method of controlling the electronic device. The method includes detecting a touch on a touch-sensitive display, determining a time of a display update of the touch-sensitive display, and adjusting a length of time of scan of the touch-sensitive display based on the time of the display update. For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The disclosure generally relates to an electronic device, which is a portable electronic device in the embodiments described herein. Examples of portable electronic devices include mobile, or handheld, wireless communication devices such as pagers, cellular phones, cellular smartphones, wireless organizers, PDAs, wirelessly enabled notebook computers, tablet computers, and so forth. The portable electronic device may also be a portable electronic device without wireless communication capabilities, such as a handheld electronic game device, digital photograph album, digital camera, or other device.

A block diagram of an example of a portable electronic device 100 is shown in FIG. 1. The portable electronic device 100 includes multiple components, such as a processor 102 that controls the overall operation of the portable electronic device 100. The processor 102 may be a single processor, a dual-core processor, or multiple processors, although the processor 102 is referred to in singular form. The portable electronic device 100 presently described optionally includes a communication subsystem 104 and a short-range communications 132 module to perform various communication functions, including data and voice communications. Data received by the portable electronic device 100 is decompressed and decrypted by a decoder 106. The communication subsystem 104 receives messages from and sends messages to a wireless network 150. The wireless network 150 may be any type of wireless network, including, but not limited to, data wireless networks, voice wireless networks, and networks that support both voice and data communications. A power source 142, such as one or more rechargeable batteries or a port to an external power supply, powers the portable electronic device 100.

The processor 102 interacts with other components, such as Random Access Memory (RAM) 108, memory 110, a touch-sensitive display 118, an auxiliary input/output (I/O) subsystem 124, a data port 126, a speaker 128, a microphone 130, short-range communications 132, and other device subsystems 134. Input via a graphical user interface is provided via the touch-sensitive display 118. The touch-sensitive display 118 includes a display 112 operatively coupled to a display controller 120 and a touch-sensitive overlay 114 operatively coupled to a touch controller 116, also referred to as a touch driver. The processor 102 interacts with the display 112 via the display controller 120. The processor 102 interacts with the touch-sensitive overlay 114 via the touch controller 116. Information, such as text, characters, symbols, images, icons, and other items that may be displayed or rendered on a portable electronic device, is displayed on the touch-sensitive display 118 via the processor 102. The processor 102 may interact with an accelerometer 136 that may be utilized to detect direction of gravitational forces or gravity-induced reaction forces, for example, to determine the orientation of the electronic device 100.

To identify a subscriber for network access, the electronic device 100 may optionally use a Subscriber Identity Module or a Removable User Identity Module (SIM/RUIM) card 138 for communication with a network, such as the wireless network 150. Alternatively, user identification information may be programmed into memory 110.

The electronic device 100 includes an operating system 146 and software programs or components 148 that are executed by the processor 102 and are typically stored in a persistent, updatable store such as the memory 110. Additional applications or programs may be loaded onto the electronic device 100 through the wireless network 150, the auxiliary I/O subsystem 124, the data port 126, the short-range communications subsystem 132, or any other suitable subsystem 134.

A received signal, such as a text message, an e-mail message, or web page download, is processed by the communication subsystem 104 and input to the processor 102. The processor 102 processes the received signal for output to the display 112 and/or to the auxiliary I/O subsystem 124. A subscriber may generate data items, for example e-mail messages, which may be transmitted over the wireless network 150 through the communication subsystem 104, for example.

One or more touches, also known as touch contacts or touch events, may be detected by the touch-sensitive display 118. The processor 102 may determine attributes of the touch, including a location of a touch. Touch location data may include an area of contact or a single point of contact, such as a point at or near a center of the area of contact. A signal is received at the touch controller 116 when a touch is detected. A touch may be detected from any suitable input member, such as a finger, thumb, appendage, or other objects, for example, a stylus, pen, or other pointer. The touch controller 116 and/or the processor 102 may detect a touch by any suitable input member on the touch-sensitive display 118. Multiple simultaneous touches may be detected.

One or more gestures may also be detected by the touch-sensitive display 118. A gesture, such as a swipe, also known as a flick, is a particular type of touch on a touch-sensitive display 118 and may begin at an origin point and continue to an end point. A gesture may be identified by attributes of the gesture, including the origin point, the end point, the distance travelled, the duration, the velocity, and the direction, for example. A gesture may be long or short in distance and/or duration. Two points of the gesture may be utilized to determine a direction of the gesture. A gesture may also include a hover. A hover may be a touch at a location that is generally unchanged over a period of time or is associated with the same selection item for a period of time.

An optional force sensor 122 or force sensors may be disposed in any suitable location, for example, between the touch-sensitive display 118 and a back of the electronic device 100 to detect a force imparted by a touch on the touch-sensitive display 118. The force sensor 122 may be a force-sensitive resistor, strain gauge, piezoelectric or piezoresistive device, pressure sensor, or other suitable device. Force as utilized throughout the specification refers to force measurements, estimates, and/or calculations, such as pressure, deformation, stress, strain, force density, force-area relationships, thrust, torque, and other effects that include force or related quantities.

Force information related to a detected touch may be utilized to select information, such as information associated with a location of a touch. For example, a touch that does not meet a force threshold may highlight a selection option, whereas a touch that meets a force threshold may select or input that selection option. Selection options include, for example, displayed or virtual keys of a keyboard; selection boxes or windows, e.g., "cancel," "delete," or "unlock"; function buttons, such as play or stop on a music player; and so forth. Different magnitudes of force may be associated with different functions or input. For example, a lesser force may result in panning, and a higher force may result in zooming.

Figure 2:
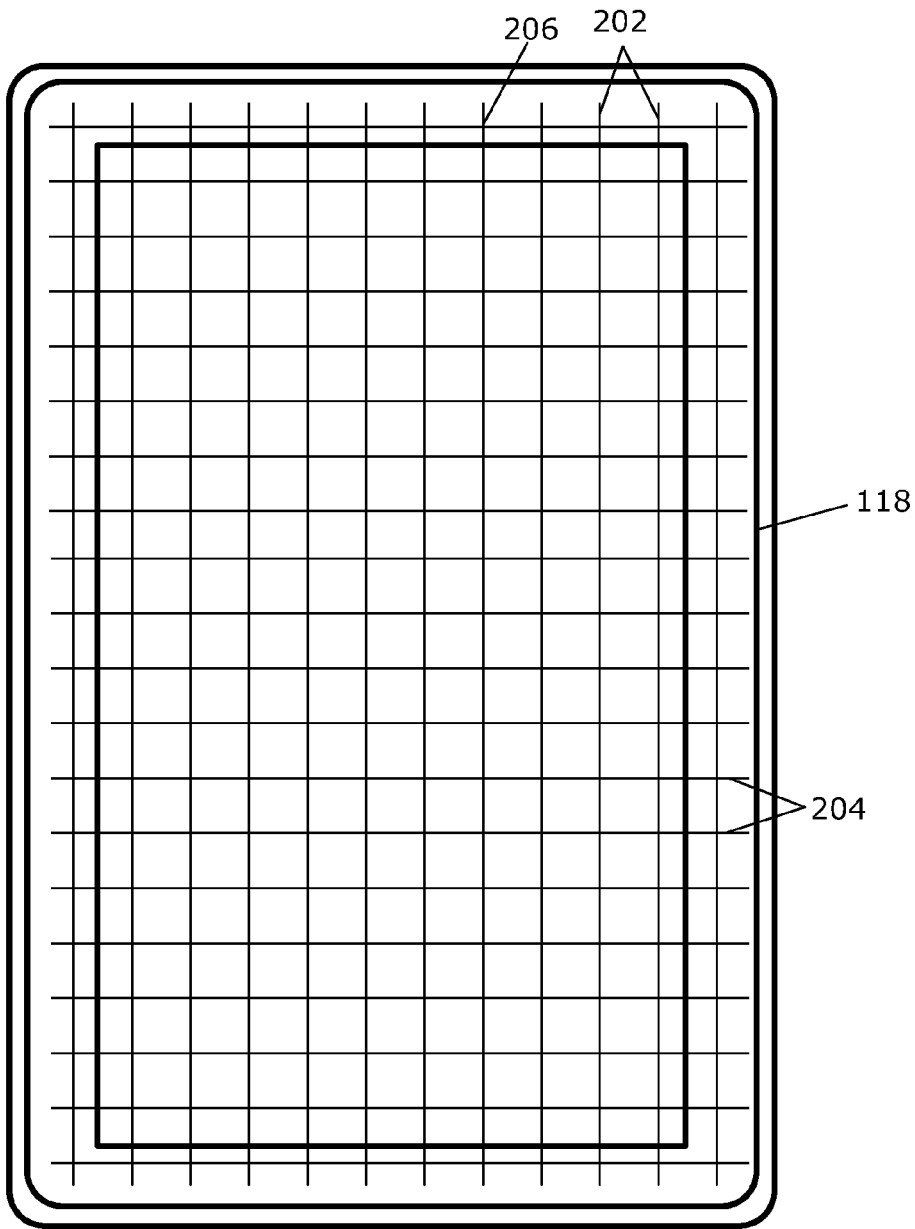
FIG. 2 is a front view of an electronic device in accordance with the disclosure.

A front view of an example of the electronic device 100 is shown in FIG. 2. The electronic device 100 includes the touch-sensitive display 118. The touch-sensitive display 118 may be a capacitive touch-sensitive display that includes capacitive touch sensors. The touch sensors include, for example, drive electrodes, also referred to as scanning electrodes, and sense electrodes. The electrodes 202 and the electrodes 204 may comprise any suitable material, such as indium tin oxide (ITO). The electrodes 202 and the electrodes 204 are not visible when viewing the electronic device 100 but are illustrated in FIG. 2 for the purpose of the present description. In the example illustrated in FIG. 2, the vertical electrodes 202 may be the drive electrodes and the horizontal electrodes 204 may be the sense electrodes. Alternatively, the horizontal electrodes 204 may be the drive electrodes and the vertical electrodes 202 may be the sense electrodes.

In this example, the drive electrodes 202 and the sense electrodes 204 are coupled to the touch controller 116, for example, via a flex connector. The drive electrodes 202 are driven by the touch controller 116 such that pulses of signal are carried by the drive electrodes 202. The signal may be, for example, current or applied voltage. The sense electrodes 204 are utilized to detect changes in the signal at the nodes 206, which are the locations at which the sense electrodes 204 cross over the drive electrodes 202. To determine a touch location, the touch-sensitive display 118 is scanned by driving the drive electrodes 202 while signals from a sense electrode 204 are received at the touch controller 116. Each scan of the touch-sensitive display 118 includes multiple frames. In each frame, a drive electrode 202 is driven utilizing multiple pulses, while receiving signals from a sense electrode 204. Each drive electrode 204 may be driven in multiple frames while sensing utilizing each of the sense electrodes 204.

Figure 3:
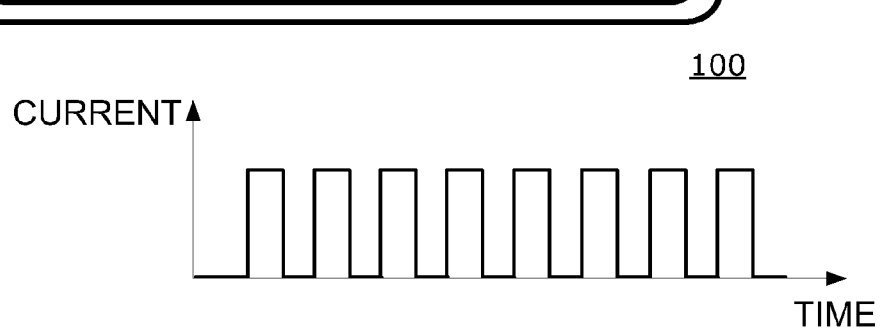
FIG. 3 illustrates pulses of current signal utilized to drive a drive electrode during scanning in accordance with the disclosure.

An example of multiple pulses 202 of signal utilized to drive a drive electrode 202 in one frame of a scan is illustrated in FIG. 3. In the example of FIG. 3, current pulses are illustrated, and a drive electrode 202 is driven utilizing 8 square wave pulses. Alternatively, the pulses may be grouped. For example, a drive electrode may be driven utilizing two groups, each comprising four pulses. The groups are separated by a period of time that may be greater than the period of time between the pulses that comprise a group.

Figure 4:
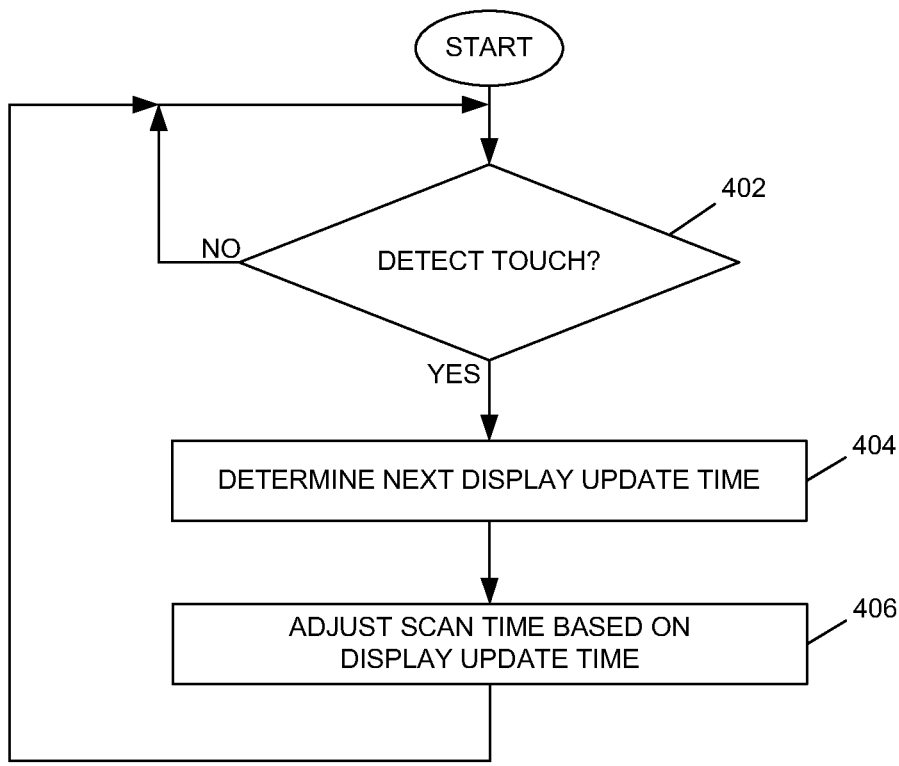
FIG. 4 is a flowchart illustrating an example of a method of detecting touches on a touch-sensitive display in accordance with the disclosure.

A flowchart illustrating an example of a method of detecting touches on the touch-sensitive display 118 is shown in FIG. 4. The method may be carried out by software executed, for example, by the touch controller 116. Coding of software for carrying out such a method is within the scope of a person of ordinary skill in the art given the present description. The method may contain additional or fewer processes than shown and/or described, and may be performed in a different order. Computer-readable code executable by at least one processor of the portable electronic device to perform the method may be stored in a computer-readable medium, such as a non-transitory computer-readable medium.

When a touch is detected 402, the next display update time is determined 404, and the length of time of a scan, or scan time, is adjusted 406 based on the display update time such that the touch data is reported by the touch controller 116 to the processor 102 in time to update the display 112 based on the touch data.

Figure 5:
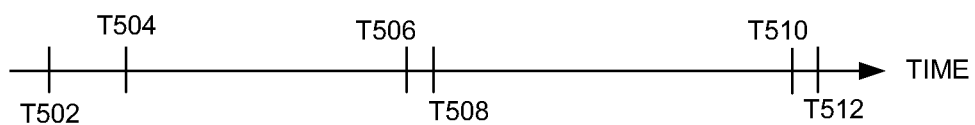
FIG. 5 and FIG. 6 are timelines illustrating detection of touches and reporting the touches in relation to the display update.

An example of a timeline illustrating detection of a touch and reporting the touch by adjusting the scan time based on the display update time is illustrated in FIG. 5.

In the example of FIG. 5, a touch is detected at time T504. The touch is detected during a scan of the touch-sensitive display 118 and prior to completion of the scan. The signals received from the sense electrodes 204 are utilized to detect a touch during the scan, rather than awaiting completion of the scan to detect a touch. For example, driving may be completed for 3 of 12 of the drive electrodes 202, but not completed for the remaining 9 of 12 of the drive electrodes 202.

The touch may be detected at the touch controller 116, based on the signals received from the sense electrodes 204 during the frames in which the first 3 drive electrodes 202 are driven.

The touch controller 116 is operably coupled to the display controller 120, and the touch controller 116 receives a signal, referred to as the Vertical Synchronization or Vsync signal, from the display controller 120. The Vsync signal is sent from the display controller 120 to the touch controller 116 each time the display 112 is updated to update the displayed information. The display 112 is updated at regular intervals of time and the Vsync signal is received by the touch controller 116 at regular intervals in time. The regular interval is determined by the touch controller 116 and the touch controller 116 determines the time of the next display update. In the example of FIG. 5, the display is updated at time T502, prior to detecting the touch at time T504. Based on the regular interval, or display update rate, the time of the next display update is determined to be time T508.

To report the touch data to the processor 102 in time to utilize the touch data in the next display update at time T508, the touch controller 116 adjusts the scan time to report the touch data to the processor 102 at time T506, prior to the display update at time T508. The touch controller 116 determines the time between time T504 and time T508. The touch controller 116 also determines the number of frames remaining in the scan and determines the length of time remaining for each frame in order to complete the scan by time T506. Based on the calculated frame time and the length of time for each pulse utilized to drive the drive electrodes 202 during scanning, the number of pulses utilized to drive each drive electrode 202 in each frame is determined. The number of pulses in each frame is decreased to decrease the time of the frame to the calculated frame time. The number of pulses is decreased to complete the scan in the time remaining until time T506. For example, the number of pulses may be decreased from 8 pulses, as illustrated in FIG. 3, to 4 pulses.

Optionally, the touch data may be reported to the processor 102 along with a confidence bit. Based on the confidence bit, the processor 102 determines whether or not to utilize the data when updating the display 112. For example, the touch controller 116 may determine a confidence bit based on the number of pulses per electrode. In this example, the confidence bit may be 75% when 6 pulses are sent rather than 8. The processor 102 may determine whether or not to use the data based on the confidence bit received from the touch controller 116 application or function performed. For example, when scrolling, the data may be utilized when a low confidence bit is reported to the processor 102 because small inaccuracies may have little effect on the function performed. When drawing on the touch-sensitive display 118, however, the accuracy of the data may be more important, and the processor may not utilize data when a low confidence bit is reported. The confidence bit may be reported to the host via a register in the interface. Each bit of the register may correspond to a confidence level, e.g., 10%, 25%, and so forth.

The scan rate may be adjusted by adjusting the number of pulses such that a subsequent scan is completed, and the touch data is reported to the controller 102 at time T510 prior to the next display update at time T512.

As described above, the pulses may be grouped. In the example in which pulses are grouped, the number of pulses in each group may be reduced. Alternatively, or in addition to reducing the number of pulses in each group, the number of groups may be reduced.

Figure 6:
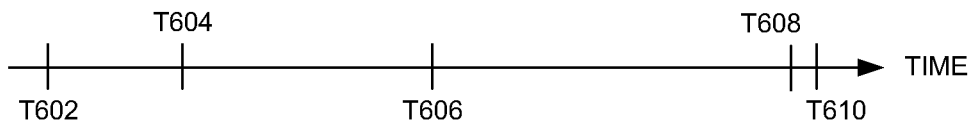

Another example of a timeline illustrating detection of a touch and reporting the touch by adjusting the scan rate based on the display update time is illustrated in FIG. 6.

In the example of FIG. 6, a touch is detected and the touch data is reported by the touch controller 116 to the processor 102 at time T604, after the display is updated at time T602. In the example of FIG. 6, the touch is detected when the full scan of the touch-sensitive display 118 is complete.

The display 112 is updated again at time T606. The time between the display update at time T606 and time T608 is determined. Time T608 is the time by which the touch data is reported to utilize the touch data when the display 112 is updated at time T610. The adjusted rate of scanning may be maintained during the touch to continue reporting touch data prior to updating the display 112.

Optionally, the touch data may be reported to the processor 102 along with a confidence bit. Based on the confidence bit, the processor 102 determines whether or not to utilize the data when updating the display 112.

When pulses are grouped, the number of pulses in each group may be reduced. Alternatively, or in addition to reducing the number of pulses in each group, the number of groups may be reduced.

By reducing the number of pulses during touch detection, the time utilized to scan the touch-sensitive display 118 is decreased. The number of pulses utilized in each frame of a scan is determined based on the time remaining until the next display update such that the touch data from the scan is reported to the processor 102 in time to utilize the touch data when updating the display 112. By adjusting the scan time to report the touch data prior to updating the display, the delay, also referred to as latency, between a touch or touch movement and displaying information relating to the touch or touch movement is reduced. For example, when drawing a line on the touch-sensitive display 118, latency causes a delay between the touch and displaying the line such that the displayed line may lag behind the touch. By adjusting the scan rate based on the display update, the lag is reduced.

A method includes detecting a touch on a touch-sensitive display, determining a time of a display update of the touch-sensitive display, and adjusting a length of time of a scan of the touch-sensitive display based on the time of the display update. An electronic device includes a touch sensitive display at at least one controller coupled to the touch-sensitive display and configured to detect a touch on the touch-sensitive display, determine a time of a display update of the touch-sensitive display, and adjust a length of time of a scan of the touch-sensitive display based on the time of the display update.

The present disclosure may be embodied in other specific forms without departing from its spirit or essential characteristics. The described embodiments are to be considered in all respects only as illustrative and not restrictive. The scope of the present disclosure is, therefore, indicated by the appended claims rather than by the foregoing description. All changes that come within the meaning and range of equivalency of the claims are to be embraced within their scope.

What is claimed is:

1. A method comprising:
   detecting a touch on a touch-sensitive display during scanning of scanning electrodes of the touch-sensitive display at a first scanning rate;
   in response to detecting the touch:
      determining a time of a next display update after detecting the touch on the touch-sensitive display and determining a report time, prior to the next display update, by which to report touch data from a scan of the touch-sensitive display in which each drive electrode is driven while sensing utilizing each sense electrode such that the touch data is utilized when updating the display in the next display update;

determining a time remaining between detecting the touch and the report time;

adjusting a length of time of the scan of the touch-sensitive display based on the time remaining between detecting the touch and the report time by scanning at a second scanning rate such that the scan is completed and the touch is reported at the report time before the time of the next display update of the touch-sensitive display;

wherein the second scanning rate is different than the first scanning rate.

2. The method according to claim 1, wherein determining a time of a next display update comprises determining a time based on a Vertical Synchronization signal from the touch-sensitive display.

3. The method according to claim 1, wherein adjusting comprises reducing a number of pulses applied to the scanning electrodes during touch sensing.

4. The method according to claim 1, wherein adjusting comprises reducing a number of groups of pulses utilized to drive each scanning electrode during touch sensing.

5. The method according to claim 1, comprising determining a length of time between display updates and adjusting the scanning rate of subsequent scans after the touch is detected, based on the length of time.

6. The method according to claim 1, comprising reporting touch data and a confidence bit to a processor.

7. The method according to claim 1, comprising determining whether or not to utilize the touch data based on the confidence bit.

8. A non-transitory computer-readable medium having computer-readable code executable by at least one processor of a portable electronic device to:

detect a touch on a touch-sensitive display during scanning of scanning electrodes of the touch-sensitive display at a first scanning rate;

in response to detecting the touch:
determine a time of a next display update after detecting the touch on the touch-sensitive display and determine a report time, prior to the next display update, by which to report touch data from a scan of the touch-sensitive display in which each drive electrode is driven while sensing utilizing each sense electrode such that the touch data is utilized when updating the display in the next display update;

determine a time remaining between detecting the touch and the report time;

adjust a length of time of the scan of the touch-sensitive display based on the time remaining between detecting the touch and the report time by scanning at a second scanning rate such that the scan is completed and the touch is reported at the report time before the time of the next display update of the touch-sensitive display;

wherein the second scanning rate is different than the first scanning rate.

9. An electronic device comprising:
a touch-sensitive display;
at least one controller coupled to the touch-sensitive display and configured to:
detect a touch on the touch-sensitive display during scanning of scanning electrodes of the touch-sensitive display at a first scanning rate,
in response to detecting the touch:
determine a time of a next display update after detecting the touch on the touch-sensitive display, and determine a report time, prior to the next display update, by which to report touch data from a scan of the touch-sensitive display in which each drive electrode is driven while sensing utilizing each sense electrode such that the touch data is utilized when updating the display in the next display update;

determine a time remaining between detecting the touch and the report time;

adjust a length of time of the scan of the touch-sensitive display based on the time remaining by scanning at a second scanning rate such that the scan is completed and the touch is reported at the report time before the time of the next display update of the touch-sensitive display;

wherein the second scanning rate is different than the first scanning rate.

10. The electronic device according to claim 9, wherein the at least one controller comprises a touch controller and a display controller coupled to the touch controller to send a Vertical Synchronization signal from the display controller to the touch controller.

11. The electronic device according to claim 9, wherein the length of time of subsequent scans is also adjusted by reducing a scanning time.

12. The electronic device according to claim 9, wherein the length of time of the scan is adjusted by reducing a number of pulses applied to scanning electrodes during touch sensing.

13. The electronic device according to claim 9, comprising a processor coupled to the at least one controller and configured to receive touch data and a confidence bit from the at least one controller and to determine whether or not to utilize the touch data based on a confidence bit.

* * * * *